US010965266B1

(12) United States Patent
Xie et al.

(10) Patent No.: US 10,965,266 B1
(45) Date of Patent: Mar. 30, 2021

(54) N-CHANNEL HIGH-POWER RF MULTIPLEXER

(71) Applicant: United States of America as represented by the Secretary of the Navy, San Diego, CA (US)

(72) Inventors: Tiaotiao Xie, San Diego, CA (US); Lu Xu, San Diego, CA (US); Frederick Verd, San Diego, CA (US); Daniel W. S. Tam, San Diego, CA (US); Nazia Mozaffar, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 69 days.

(21) Appl. No.: 16/600,150

(22) Filed: Oct. 11, 2019

(51) Int. Cl.
| | |
|---|---|
| *H01Q 5/50* | (2015.01) |
| *H03H 7/46* | (2006.01) |
| *H03H 7/01* | (2006.01) |
| *H05K 1/02* | (2006.01) |
| *H01Q 5/335* | (2015.01) |
| *H01Q 1/02* | (2006.01) |
| *H05K 1/16* | (2006.01) |

(52) U.S. Cl.
CPC ............. *H03H 7/461* (2013.01); *H01Q 1/02* (2013.01); *H01Q 5/335* (2015.01); *H01Q 5/50* (2015.01); *H03H 7/0115* (2013.01); *H03H 7/0161* (2013.01); *H05K 1/0203* (2013.01); *H05K 1/025* (2013.01); *H05K 1/0243* (2013.01); *H05K 1/162* (2013.01); *H05K 2201/066* (2013.01)

(58) Field of Classification Search
CPC .... H01Q 5/30–5/50; H03H 7/01; H03H 7/461
See application file for complete search history.

(56) References Cited

U.S. PATENT DOCUMENTS

| | | | |
|---|---|---|---|
| 10,305,449 B2* | 5/2019 | Takamine | H03H 9/725 |
| 2014/0167877 A1* | 6/2014 | Shimizu | H03H 7/38 |
| | | | 333/101 |
| 2020/0235760 A1* | 7/2020 | Nakajima | H03H 7/1766 |

OTHER PUBLICATIONS

L-COM; RF Filters/Splitters Tutorial; Available online at http://www.l-com.com/content/RF-Filters-Splitters-Tutorial.html; available at least by Sep. 3, 2019.

(Continued)

*Primary Examiner* — Hasan Islam
(74) *Attorney, Agent, or Firm* — Naval Information Warfare Center, Pacific; Kyle Eppele; J. Eric Anderson (57) ABSTRACT

A method for reducing a quantity of cable runs to antennas can include the step of providing a circuit of reactive elements coupled between an input terminal and at least two output terminals. The circuit can be used to separate a broadband signal into two or more disjoint expected frequency ranges. The circuit can match the impedance at the at least two output terminals to the impedance expected by the antennas. The elements of the circuit can have reactances and arrangement so that when a broadband RF signal is applied at the input terminal, two or more disjoint expected frequencies can be applied to the respective output terminals. The power at each output terminal can sufficiently match the antennas' expected power, and insertion losses can be minimized.

20 Claims, 8 Drawing Sheets

(56) References Cited

OTHER PUBLICATIONS

S.M. Shajedul Hasan, Steven W. Ellingson, "Integration of Simple Antenna to Multiband Receivers using a Novel Multiplexer Design Methodology," IEEE Trans. Antennas Propag., vol. 60, No. 3, pp. 1550-1556, Mar. 2012.

C. Feng, X. Guo, B. Cao, B. Wei, X. Zhang, Y. Hong, Z. Ying, Q. Li, and G. Zhang, "Design and Optimization of a Compact Superconducting Quadruplexer at VHF-Band With an Accurate Equivalent Circuit Model," IEEE Trans. Appl. Supercond., vol. 23, No. 6, Dec. 2013.

R. Y. C. Ho and B. Battensby, "Subminiature Microwave Active Filter Manifolds," G-MTT Int. Microwave Symp., pp. 62-65, 1970.

S. Gopani, R. Mouton, R. Hays, R. Almar, J. Vandendriessche and M. Garrity, "State-of-the-art SAW Channelizer for EW Receiver Application," Proc. IEEE Ultrasonics Symp., vol. 1, pp. 55-60, 1994.

L. Luo, T. Su, Z. Ren, and B. Wu, "Design of Helical Filters Manifold Multiplexer Using a Novel Equivalent Circuit Model," Int. Symp. on Signals, Systems and Electronics, vol. 1, pp. 1-4, 2010.

D. Malafaia, J. P. Magalhaes, J. Vieira, and N. B. Carvalho, "Real Time Front-end for Cognitive Radio Inspired by the Human Cochlea," IEEE Radio and Wireless Symp., pp. 16-18, 2013.

J. P. Magalhaes, J. M. N. Vieira, R. Gomez-Garcia, and N. B. Carvalho, "Bio-Inspired Hybrid Filter Bank for Software-Defined Radio Receivers," IEEE Trans. Microw. Theory Tech., vol. 61, No. 4, pp. 1455-1466, Apr. 2013.

G. Cafaro, T. Gradishar, J. Heck, S. Machan, G. Nagaraj, S. Olson, R. Salvi, B. Stengel, and B. Ziemer, "A 100MHz 2.5GHz Direct Conversion CMOS Transceiver for SDR Applications," IEEE Radio Frequency Integrated Circuits Symp., pp. 189-192, 2007.

S. M. S. Hasan, and S. W. Ellingson, "Multiband Antenna-Receiver Integration using an RF Multiplexer with Sensitivity-Constrained Design," IEEE Antennas and Propag. Soc. Int. Symp., pp. 1-4, 2008.

C. J. Galbraith, and G. M. Rebeiz, "Higher Order Cochlea-Like Channelizing Filters," IEEE Trans. Microw. Theory Tech., vol. 56, No. 7, pp. 1675-1683, Jul. 2008.

C. J. Galbraith, R. D. White, L. Cheng, K. Grosh, and G. M. Rebeiz, "Cochlea-Based RF Channelizing Filters," IEEE Trans. Circuits Syst. I, Reg. Papers, vol. 55, No. 4, pp. 969-979, May 2008.

Y. Ou, and G. M. Rebeiz, "A 20-90MHz 26-Channel Cochlear-Based Channelizer," IEEE MTT-S Int. Microwave Symp., pp. 213-216, 2010.

A. Grichener, Y. Ou, and G. M. Rebelz, "A 60-90MHz Cochlear-Based Channelizer," IEEE Biomedical Circuits and Systems Conf., pp. 285-288, 2011.

Shitang He, Wen Wang, Shunzhou Li, Jiansheng Liu, Yong Liang, "21 Channel SAW Channelizer Filter Bank," IEEE Ultrasonics Symp., vol. 3, pp. 1918-1921, 2004.

\* cited by examiner

N-CHANNEL HIGH-POWER RF MULTIPLEXER

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 72120, San Diego, Calif., 92152; telephone (619) 553-5118; email: ssc_pac_t2@navy.mil. Reference Navy Case No. 106,172.

BACKGROUND OF THE INVENTION

The present invention is generally drawn to a method and a device for reducing the number of cable runs to antennas.

Antennas can be used in communications. Antennas can receive and/or transmit messages by superimposing information (e.g. by amplitude and/or frequency modulation) on carrier electromagnetic waves, as is known in the art. Traditionally, the signals to/from each antenna can be relayed to/from another part of the communication system via a dedicated cable coupled to each of the antennas (i.e., a dedicated cable run between the antenna and the rest of the communication system, usually the console). The cables can each be a radio frequency (RF) cable.

However, the arrangement in the prior art can become problematic. Often time, the cable, which can be quite heavy and must be run hundreds of feet from the antenna to the rest of the system. As communication needs increase (communication needs rarely decrease), more and more antennas are needed, which means more and more cable runs are needed. This can increase the weight of the hosting platform. For hosting platforms that are naval vessels, the additional weight can be significant enough so that the center of buoyancy is affected. Additionally, the cable must be run through watertight bulkheads, which means that an opening in the bulkhead must be formed, the cable run through the opening, and then the opening must be made watertight again. This can be a tedious, expensive endeavor, and the end result is typically not as watertight as the original bulkhead. Meanwhile, mobile platforms that have such antennas systems, can require communication systems having greatly reduced weight, complexity, and points of failure. Example mobile platforms can be mobile vehicles, submarines, trains, ships, trucks, amphibious vehicles, flying vehicles, launch vehicles, and/or satellites. Some have attempted to solve this problem through the use of multiplexers. However prior art multiplexers are unsuitable for high-power applications. Accordingly, for at least the foregoing reasons, there exists a need for an improved multiplexer.

SUMMARY OF THE INVENTION

Described herein is a high-power multiplexer, an embodiment of which comprises an input terminal, at least two inductive elements, a number of bandpass filters, and at least two output terminals. The input terminal is configured for receiving a signal at a first RF frequency range. A first of the at least two inductive elements is arranged in series with the input terminal. The number of bandpass filters is equal to the number of inductive elements. Each bandpass filter corresponds to, and is electrically connected in series to, one of the inductive elements. Each bandpass filter has a respective frequency range and the bandpass filter having the highest frequency range is arranged electrically proximal in series with the first inductive element. The at least two bandpass filters are arranged by decreasing respective higher frequency such that the bandpass filter with the highest frequency is connected to the input terminal and each subsequent bandpass filter is increasingly electrically distant to the input terminal. A last of the at least two inductive elements is arranged in series with a last bandpass filter having the lowest top end. The number of output terminals is equal to the number of bandpass filters, and each output terminal is arranged in series with one of the at least two bandpass filters to comprise a respective filter block. Each subsequent pair of filters blocks are spaced apart by one of the inductive elements, and each filter block is arranged in parallel with a respective circuit block. The respective circuit block comprises: i) each other filter block that has a lower bandpass higher frequency than said filter block, and ii) respective inductive elements of said each other filter blocks.

Also described herein is a method for reducing a quantity of cable runs to antennas by using an embodiment of the high-power multiplexer that comprises the following steps. The first step provides for providing an input terminal, the input terminal configured to receive a broadband RF signal from a single input cable. Another step provides for providing at least two output terminals. Each output terminal is configured to transmit output signals to a respective antenna. The respective antennas have certain i) impedances, ii) signal frequency ranges, and iii) signal power for the output signals. Another step provides for providing a circuit of reactive elements coupled between the input terminal and the at least two output terminals. The circuit is configured for separating the broadband signal into two or more disjoint frequency ranges. The circuit is further configured so that the circuit matches the impedance of the at least two output terminals to the impedance of each of the respective antennas. The reactances and the arrangement of reactive elements in the circuit are selected such that when a broadband RF signal is applied at the input terminal each of the two or more disjoint certain frequency ranges are applied at the respective output terminals. The reactances and the arrangement of reactive elements in the circuit are also selected such that the impedance of the circuit at each output terminal sufficiently matches the certain output terminal impedance and that the power at each output terminal sufficiently matches the certain power and insertion losses are minimized.

Another embodiment of the high-power multiplexer may be described as comprising a first terminal, a first high pass filter, and a first low pass filter. The first high pass filter has a first plurality of inductive elements arranged in series between the first terminal and a second terminal. The first high pass filter also has a first plurality of capacitive elements connected in parallel with the first plurality of inductive elements. Each connection point between two inductive elements of the first plurality of inductive elements is connected to a first end of a respective capacitive element. Second ends of each of the first plurality of capacitive elements are electrically connected. The first low pass filter has a second plurality of capacitive elements arranged in series between the first terminal and a third terminal. The first low pass filter also has a second plurality of inductive elements connected in parallel with the second plurality of capacitive elements. Each connection point between two capacitive elements of the second plurality of capacitive elements is connected to a first end of a respective inductive element of the second plurality of inductive elements. Second ends of each of the second plurality of inductive elements are electrically connected.

BRIEF DESCRIPTION OF THE DRAWINGS

The accompanying drawings, which are incorporated in and form a part of the specification, illustrate example embodiments and, together with the description, serve to explain the principles of the invention. Throughout the several views, like elements are referenced using like references. The elements in the figures are not drawn to scale and some dimensions are exaggerated for clarity.

DETAILED DESCRIPTION OF THE EMBODIMENTS

Figure 1A:
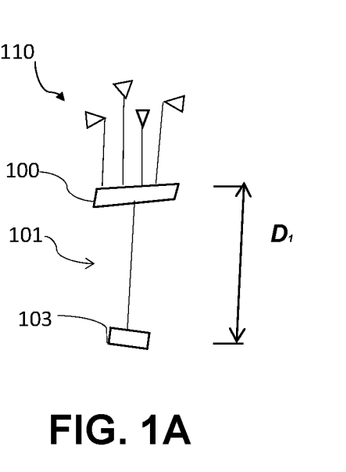
FIG. 1A is a representation of a four-channel multiplexer.

FIG. 1A is a simple illustration of a high-power multiplexer 100 for reducing the number of cables of communications systems between a system's antennas and the rest of the system. A single cable 101, instead of multiple cables (e.g. four cables), may be coupled between communication electronics 103 and high-power multiplexer 100. The single cable 101, may span at least a portion $D_1$ of the distance between the communication electronics 103 and the antennas 110, instead of multiple cables. Thus, if a single cable 101 is used in conjunction with the high-power multiplexer 100 to replace four cables, the high-power multiplexer 100 would allow for a weight savings of three cables spanning distance $D_1$ from the high-power multiplexer 100 to the communication electronics 103. It may be advantageous (in terms of overall cable weight savings) to position the high-power multiplexer 100 closer to the antennas 110 than the communications electronics 103 in the overall average distance between the antennas 110 and the electronics 103. As used herein, the phrase "high-power" may be defined as having a power-handling capability of greater than or equal to three watts. For example one embodiment of the high-power multiplexer 100 may have power-handling capabilities as follows: 1000 watts for high frequencies (3-30 MHz), 250 watts for very high frequencies (30-300 MHz), and 100 watts for ultra-high frequencies (300 MHz-3 GHz).

It should be appreciated that the high-power multiplexer 100 may have multiple terminals. For example, the high-power multiplexer 100 is depicted in FIG. 1A as having four terminals, one for each of the antennas 110. It is appreciated that the multiple terminals may be input terminals if the signals from the antennas 110 are intended to be input to the high-power multiplexer 100 for further relay to the communications electronics 103. It is appreciated that the multiple terminals may be output terminals if the signal(s) from the communications electronics 103 are to be output to the antennas 110. In other words, the high-power multiplexer 100 is bidirectional such that it may serve as a multiplexer or a demultiplexer. The cables leading from the high-power multiplexer 100 to the antennas 110 may have an average length. The length of the cable 101 may be 1.25 times or more, 2 times or more, 3 times or more, 5 times or more than the average length of the cables from the device to the antennas 110.

Figure 1B:
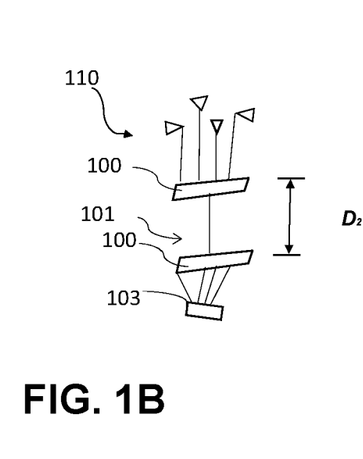
FIG. 1B is a representation of a four-channel multiplexer connected to a four-channel demultiplexer.

FIG. 1B illustrates block diagram of use case for high-power multiplexer 100 for reducing the number of cable runs for a portion $D_2$ of the distance between antennas 110 and communications electronics 103 for two high-power multiplexers 100 that can be coupled to either side of the cable 101, one serving as a multiplexer, the other serving as a demultiplexer. This configuration may be used where the communication electronics 103 has multiple terminals. The communication electronics 103 may require the multiple signals from/to the antennas 110 to be routed into a respective terminal such as for multiple radios. The radios may be tunable radios, and components of the high-power multiplexer 100 may be tunable. Each of the high-power multiplexers 100 shown in FIG. 1B has the same components and configuration as the other and are laid out in the mirror image of each other (i.e., one high-power multiplexer 100 has one input and multiple outputs, the other has multiple inputs and one output).

Figure 2:
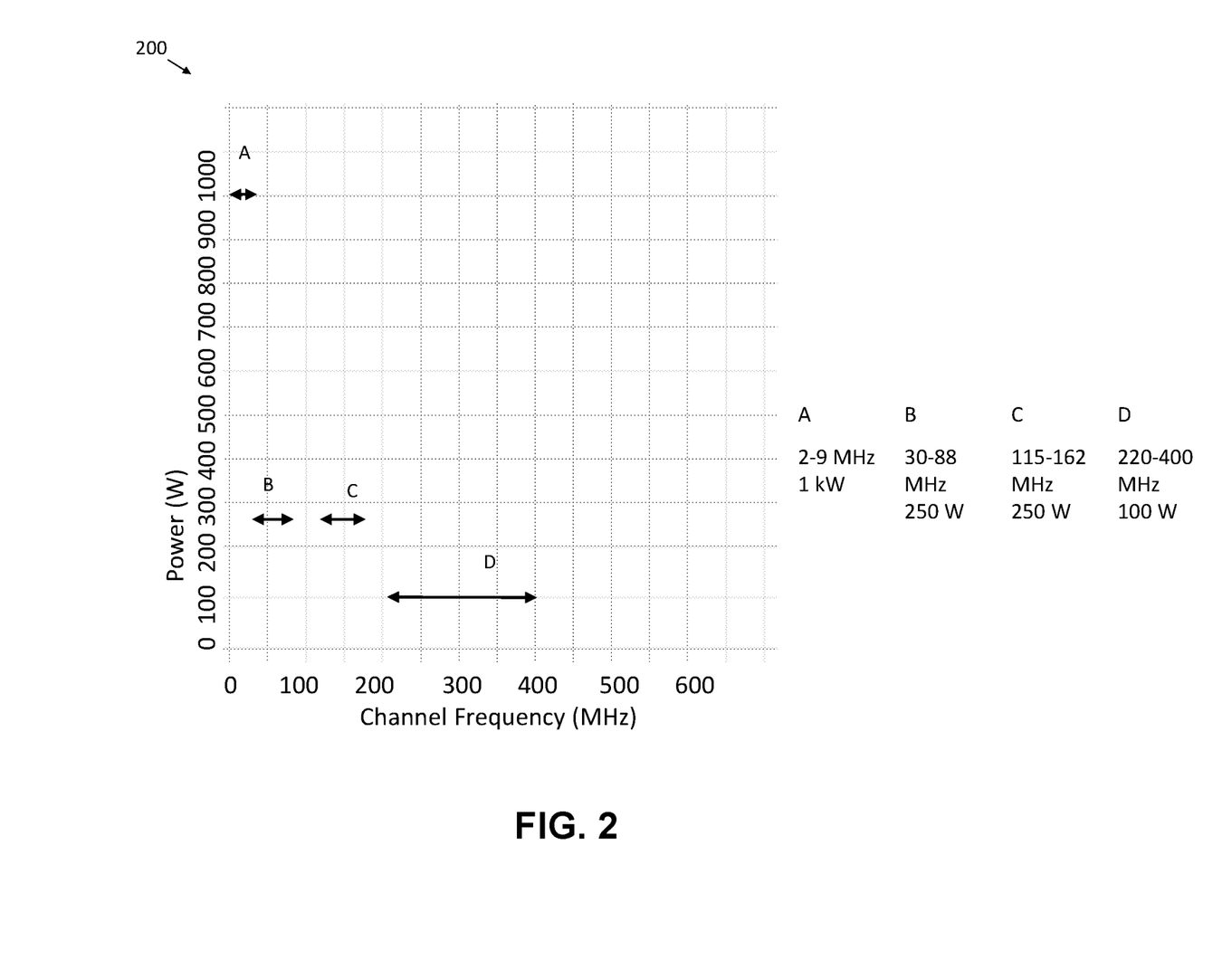
FIG. 2 is a graph of channel frequency versus power for four different antennas.

FIG. 2 illustrates a graph 200 of example signal frequency ranges and signal power levels for antennas 110 that may be accommodated by the high-power multiplexer 100. The high-power multiplexer 100 can transform an input broadband signal input into required signals for two or more antennas 110. The high-power multiplexer 100 can transform signals from two or more antennas 110 into a single broadband signal required by communications electronics 103 (or to be input into another high-power multiplexer 100 as seen in FIG. 1B). The broadband signal may be a communication signal for processing by communications electronics, including radios.

It can be appreciated that each antenna of the antennas 110 may have disjoint frequency ranges. For example, FIG. 2 illustrates signal power and frequency characteristics for four different antennas: A, B, C, and D. Antenna A has a frequency range of 2-9 MHz, at 1 kW, and a Voltage Standing Wave Ratio of 4:1 VSWR. Antenna B has a frequency range of 30-88 MHz, at 250 W, 3.5:1 VSWR. Antenna C has a frequency range of 115-162 MHz, at 250 W, 2:1 VSWR. Antenna D has a frequency range of 220-400 MHz, at 100 W, 2:1 VSWR.

The following is a description of characteristics of another example embodiment of the antennas 110 having eight separate antennas. In this embodiment, the first antenna has a frequency range of 7-30 MHz, at 1 kW, 4:1 VSWR. The second antenna in this embodiment has a frequency ranges of 118-174 MHz, at 250 W, 2:1 VSWR. The third antenna in this embodiment has a frequency ranges of 225-460 MHz, at 100 W, 2:1 VSWR. The fourth antenna in this embodiment has a frequency range within 1-9 MHz. The fifth antenna in this embodiment has a frequency range within 24-96 MHz. The sixth antenna in this embodiment has a frequency range of 2.5 to 12 MHz. The seventh antenna in this embodiment has a frequency range within 10-95 MHz. The eighth antenna in this embodiment has a frequency range within 200-470 MHz. In this embodiment of the antennas 110, the antennas 110 operate at a power level 0.15 to 5 kW. The communications electronics 130 may require signals at scaled power compared to signals to/from the antennas 110. It is appreciated that the antennas 110 may each operate at disjoint frequency ranges, where disjoint means no two antennas have overlapping required passbands. Two or more antennas 110 may have at least partially overlapping frequency ranges.

It can be appreciated that the high-power multiplexer 100 may provide relatively good signal transmission with low loss in the passband of frequencies required by each antenna of the antennas 110. It is appreciated that the high-power multiplexer 100 may provide a low transmission in the frequencies outside of the passband, Stated otherwise, the high-power multiplexer 100 may provide a high out-of-band rejection to each antenna. It is appreciated that the antennas 110 can each have an expected impedance, signal frequency range, and signal power, and the high-power multiplexer 100 can provide each antenna 110 with signals of expected frequency, power, and at the required input impedance. An expected high-power antenna power can be 100 to 3000 W.

Some embodiments of the high-power multiplexer 100 include capacitive elements, have reactances that can be selected such that impedance at the input terminal can substantially match the impedance of at least one of the at least two output terminals. Reactances of the elements of the high-power multiplexer 100 can be selected such that an impedance at the output terminals can match an impedance expected by antennas coupled to the output terminals. An expected impedance can be 50 Ohms. The reactances and/or the arrangement of the elements of the high-power multiplexer 100 can be selected such that insertion losses and power losses in the high-power multiplexer 100 can be minimized.

Although not shown in FIG. 2, the antennas 110 and/or communications electronics 103 can require 1 dB or less insertion loss (at the required frequency range), with at least 20 dB channel isolation. The antennas 110 and/or communications electronics 103 can require less than 1 dB insertion loss (such as 0.5 dB), with at least 35 dB channel isolation. The upper/lower channel isolation may be 35 dB, 40 dB, 45 dB, 50 dB, 68 dB, 70 dB, 71 dB, 79 dB, 86 dB, or 90 dB.

FIGS. 3A-3H illustrate example embodiments of the high-power multiplexer 100 that comprise a cochlear and manifold configuration of circuit elements. A cochlear and manifold configuration for the high-power multiplexer 100, may have a first terminal 301, and two or more other terminals 305. The first terminal 301 may be a terminal for input signal to the high-power multiplexer 100, where the input is a broadband signal. The broadband signal may be transferred to the high-power multiplexer 100 via single cable 101 (Not shown in FIGS. 3A-3H, please see FIGS. 1A-1B). The input at first terminal 301 may be from communications electronics 103 such as is shown in the depiction of the embodiment of the high-power multiplexer 100 of FIG. 1A, where the two or more other terminals 305 are output terminals for providing communications (or other) signals to antennas 110 (Not shown in FIGS. 3A-3H, please see FIGS. 1A-1B).

Alternatively, the first terminal 301 may be a terminal for an output signal of the high-power multiplexer 100, where the output is a broadband signal. The broadband signal may be transferred from the high-power multiplexer 100 from output terminal 301, via single cable 101, to communications device 103 (or another input of a communications device 103 as seen in FIG. 1B). In the case where terminal 301 is an output, the two or more terminals 305 may be input to the high-power multiplexer 100. The input terminals may be signals from antenna 110.

Figure 3A:
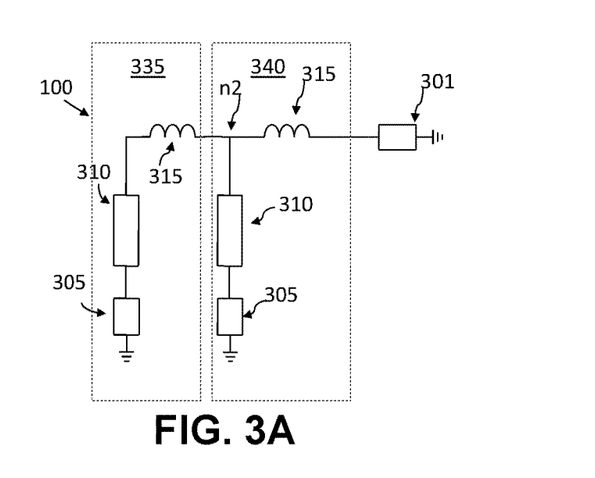
FIGS. 3A-3H are circuit diagrams.

The embodiment of the high-power multiplexer 100 shown in FIG. 3A has two bandpass filter blocks 310. The bandpass filter block 310 may be a multi-order bandpass filter. The bandpass filter block 310 may have a Chebychev topology, Bessel topology, Butterworth topology, or other topologies as known in the art. The bandpass filters 310 can have a passband frequency range. The bandpass filter block 310 may have a frequency range. A frequency may be outside of the passband and/or frequency range if that frequency applied at a terminal of the bandpass filter block 310 is attenuated with less than a −3 dB attenuation at the other terminals of the bandpass filter block 310. The lower and higher frequencies in the frequency range may be the frequencies with approximately −0.3 dB, −0.5 dB, −1 dB, or −3 dB attenuation. The lower and higher frequencies in the frequency range may be the frequencies with the second −3 dB attenuation, for example, in a Chebychev topology of the bandpass filter block 310. A frequency may be within the passband and/or within the frequency range for the bandpass filter block 310, if a signal that has that frequency applied at an input terminal of the bandpass filter block 310, appear at the other of two terminals of the bandpass filter block 310 with not less than −3 dB attenuation. The signal with a 0 dB attenuation may be the fundamental, or resonance, or mid-band frequency. The lower frequency in a given passband may be referred to herein as a bottom end and the higher frequency in the given passband may be referred to herein as a top end.

It is appreciated that the passband of the bandpass filter and/or the frequency range of the filter block 310 may be approximately equal to the desired frequency range of the antennas 110, and/or communication devices 103, which can be coupled to the one or more terminals 305.

Figure 3B:
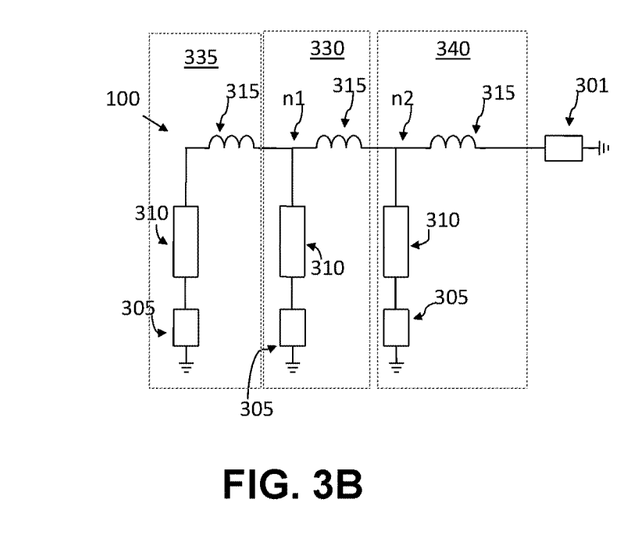
Figure 3C:
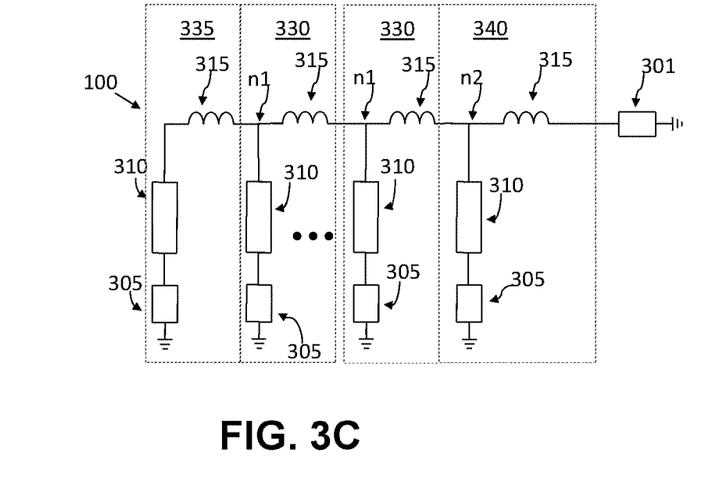

As shown in FIGS. 3A-3C, the high-power multiplexer 100 may further have one or more inductive element 315, where each inductive element 315 can be comprised of one or more inductors. The inductive elements 315 may be designed to minimize loss from the first terminal 301 of the device to the two or more filter blocks 310. Inductance of the inductive elements may be selected to match impedance in the high-power multiplexer 100 and/or to minimize insertion losses in the device 110. The high-power multiplexer 100 may be disposed on a printed circuit board (PCB), and the inductance of the at least two inductive elements 315 can be determined to minimize the loss across conductive traces of the PCB from first terminal 301 to the filter blocks 310. The inductive elements 315 may have filtering properties. The inductance of the at least two inductive elements can be determined to match the impedance across conductive traces of the PCB from the input terminal to each bandpass filter block 310.

It can be appreciated that the number of inductive elements 315 may be equal to the number of filter blocks 310. In one example embodiment, the inductive elements 315 can have an inductance of 3 nH, but it is to be understood that the inductive elements 315 are not limited to that value.

Now referring to FIGS. 3A-3C, there can be one circuit block 335, one circuit block 340, and zero (FIG. 3A) or more (FIGS. 3B-3C) circuit blocks 330. The circuit block 335 can include the aforementioned inductive element 315, in series with a bandpass filter block 310, and terminal 305. Circuit block 330 can include inductor 315, bandpass filter block 310, and terminal 305. Terminal 305 of circuit block 330 can be in series with bandpass filter block 310 of that circuit block 330. Circuit block 335 can be coupled to circuit block 330, at a node n1 (FIGS. 3B-3C) between the bandpass filter block 310 of circuit block 330 and inductive element 315 of circuit block 330.

The circuit block 340 can have an inductive element 315 in series with terminal 301, and a bandpass filter block 310 in series with the terminal 305 (and the inductive element 315). The series combination of bandpass filter block 310 and terminal 305, can be parallel to the series combination of inductive element 315 belonging to circuit block 340 and terminal 301. A node n2 of circuit block 340 can be between bandpass filter block 310 of circuit block 340, and inductive element 315 of the most electrically proximal (adjacent) circuit block 330 or circuit block 340). In other words, node n2 of circuit block 340 is disposed at the three-way junction of the bandpass filter block 310 of circuit block 340, the inductive element 315 of circuit block 330, and the inductive element 315 of circuit block 340. (See FIG. 3B). In other words, the inductive element 315 of circuit block 330, can be arranged between node n1 of circuit block 330, and the node n2 of circuit block 340.

For designing an embodiment of the high-power multiplexer 100 with a cochlear manifold configuration for interfacing with two or more antennas, zero or more circuit blocks 330 can be used. It is appreciated that for interfacing two or more antennas, the high-power multiplexer 100 can include a single terminal 301, a circuit block 340, a circuit block 335, and two less than the number of antennas, of circuit block 330. In total, there can be the same number of terminals 305 as the number of antennas to be interfaced with, with each respective terminal 305 belonging to circuit block 340, circuit block 335, and each of the circuit block(s) 330 (if included).

Moreover, if required in the design of a given embodiment of the high-power multiplexer 100, the multiple circuit blocks 330 can be arranged between circuit blocks 335 and circuit block 340, with circuit block 335 coupled to node n1 of one of the circuit blocks 330. The inductive element 315 of that circuit blocks 330 can be coupled to node n1 of another circuit block 330. Inductive element 315 of another (electrically proximal) of the multiple circuit blocks 330 can be coupled to node n2 of circuit block 340. It can be appreciated that for N terminals, N−2 blocks 330 can be repeated. Circuit block 335 can include bandpass filter block 310 having the passband with the lowest top end. Circuit block 340 can have bandpass filter block 310 having the passband with the highest top end of the circuit blocks 310 of the high-power multiplexer 100. If required in the design of the high-power multiplexer 100, the circuit block 335 may be coupled to the circuit block 330 having the passband with the lowest top end out of all of the circuit blocks 330. Each of the circuit blocks 330 can be arranged by decreasing higher frequency of the frequency range of each bandpass filter block 310 belonging to that circuit block 330.

For example, FIG. 3A shows and embodiment of the high-power multiplexer 100 for interfacing with two antennas (not shown in FIG. 3A) via terminals 305. A single circuit block 330 can couple to a single circuit block 340, at node n2 of circuit block 340. A terminal 301 in series with inductive element 315 of circuit block 340, can be, for example, for interfacing with a single cable 101 (not shown in FIG. 3A).

FIG. 3B shows another example embodiment of the high-power multiplexer 100 for interfacing with three antennas (not shown in FIG. 3B) via respective terminals 305. The high-power multiplexer 100 can have one circuit block 330, having a terminal 305 in series with bandpass filter block 310, and the bandpass filter block 310 coupled to inductive element 315 at node n1. A block 335 (as described above), can couple to block 330 at node n1. A block 340 can be coupled between block 330 and the terminal 301 as described above.

FIG. 3C shows another embodiment of the high-power multiplexer 100 for interfacing with four antennas (not shown in FIG. 3C) via four terminals 305. As shown, two of the circuit blocks 330 can be repeated, with a circuit block 335 coupled to node n1 of one of the circuit blocks 330. An inductive element of that one of the circuit blocks 310 can be coupled to node n1 of another of the two circuit blocks 310. The inductive element 315 of that another of the two circuit blocks 310, can be coupled to node n2 of the circuit block 340.

For clarity in designing different embodiments of the high-power multiplexer 100 for interfacing between five or more antennas (not shown in FIGs), ellipses are shown between the two blocks 330 in FIG. 3C which shows the device for interfacing with four antennas. It can be appreciated that embodiments of the high-power multiplexer 100 for interfacing with five or more antennas, can have three or more of circuit blocks 330, with the inductive element 315 of each of the circuit blocks 330 (except for one circuit block 330, which has inductive element 315 connected to node n2 of its adjacent circuit block 340), connected to node n1 of the adjacent circuit block 330.

The filter blocks 310 may be arranged by decreasing higher frequency of the frequency range of each bandpass filter block 310. The filter blocks 310 may be arranged by decreasing midband frequency and/or fundamental frequency. The filter blocks may be arranged by decreasing smaller frequency of the frequency range of each bandpass filter block 310. The bandpass filter block 310 with the highest frequency of the respective frequency range of the bandpass filter block 310, and/or highest mid-band frequency and/or highest fundamental frequency, and/or higher bottom end of the respective frequency ranges of the filter blocks 310, may be positioned proximal to the first terminal 301. That bandpass filter block 310 may be electrically proximal to the first terminal 301. Electrically proximal filter 310 can be taken to mean the least impedance difference, or smallest potential difference, between the first terminal 301 and all other filter blocks 310, but not necessarily be the most physically proximate bandpass filter block 310 to the first terminal 301.

If the filter blocks 310 are arranged by decreasing frequencies (see section above), each subsequent pair of filters blocks 310 can be spaced apart by one of the inductive elements 315, and each bandpass filter block 310, together with a respective circuit block (not shown in FIGs) for the respective other terminal 305 for that block 310, can be arranged in parallel, which can include: i) Each other bandpass filter block 310 that has a lower bandpass higher frequency (or lower midband frequency) than that bandpass filter block 310; ii) Respective inductive elements 310 of said each other filter blocks 310; and, ii) Respective terminals 305 of said each other filter blocks 310. For example, now referring to FIG. 3B, a circuit block (not shown) that includes bandpass filter block 310 and terminal 305 of circuit block 330, at node n1 of block 330, is arranged in parallel with circuit block 335. Block 335 can include an inductive element 315, in series with a bandpass filter block 310 that has a lower bandpass higher frequency (or lower midband frequency) than the bandpass filter block 310 of circuit block 330, and terminal 305.

Referring now to FIGS. 3D-3H, example filter blocks 310 are shown according to several embodiments can be shown in greater schematic detail. As shown, the filter blocks 310 can be bandpass filters as described herein, and can include one or more inductive elements and one or more capacitive elements. The higher cutoff frequency of the bandpass filter (so the higher frequency of the pass band) may be determined by any combination of inductive elements in series with a terminal of the bandpass filter block 310, and/or capacitive elements in parallel with the terminal (or a load applied at the terminal). The lower cutoff frequency of the bandpass filter (so the lower frequency of the pass band) may be determined by any combination of capacitive elements in series with a terminal of the bandpass filter block 310, and/or inductive elements in parallel with the terminal (or a load applied at the terminal).

Figure 3D:
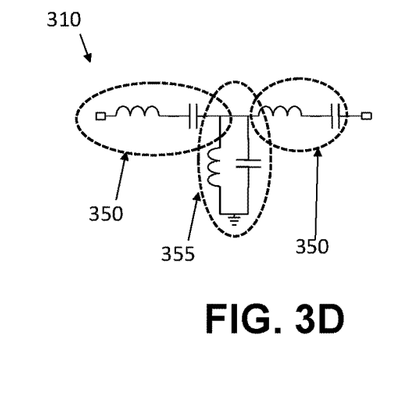

As shown in FIG. 3D, series stage 350 of the filter 310 can be an inductive element in series with a capacitive element and together in series with one of the two or more other terminals 305 of the device (see in FIGS. 3A-3C). This series stage 350 may be a series resonant band-pass filter. A parallel stage 355 of the bandpass filter block 310 can be an inductive element in parallel with a capacitive element and together in parallel with one of the two or more other terminals 305 of the device (see in FIGS. 3A-3C). The parallel capacitive element in second stage 355 may be used to shunt unwanted frequencies to ground.

It can be appreciated that any number of stages can be used to make up the bandpass filter block 310, including any number of series stages 350 and parallel stages 355. In some embodiments, no two stages of the same type (series stage 350, parallel stages 355) can be adjacent. There can be an odd number of bandpass stages, and reactances of elements of the stages can be symmetric about a middle bandpass stage in an ordered arrangement of stages. In other embodiments, the middle bandpass stage can be arranged as a parallel stage 355. In still other embodiments, the middle bandpass stage can be arranges as a series stage 350. Further, the reactances of the elements of the stages can be selected such that the stages are ordered with higher resonant frequencies arranged proximal to the middle stage.

Figure 3E:
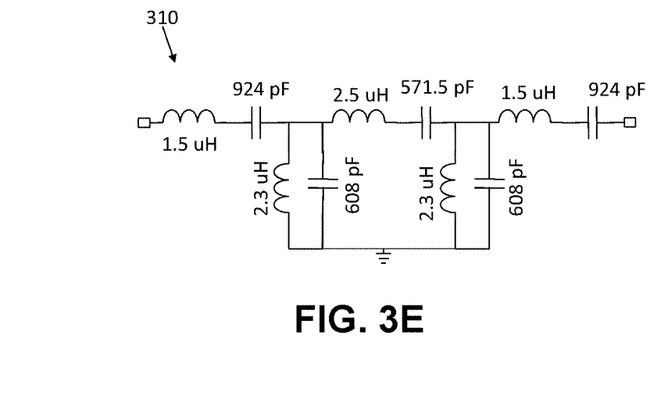

FIG. 3E shows an example embodiment of the bandpass filter block 310 having a multistage bandpass configuration, for coupling to antenna with frequency range A of 2-9 MHz (Please see FIG. 2).

Figure 3F:
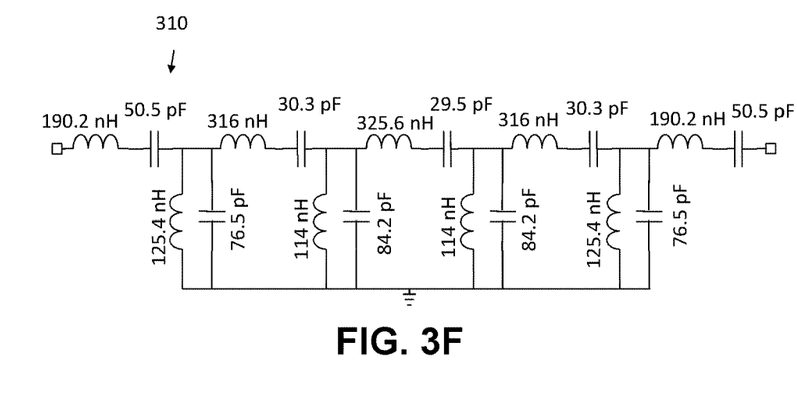

FIG. 3F shows an example embodiment of the bandpass filter block 310 having a multistage bandpass configuration, for coupling to antenna with frequency range B of 30-88 MHz (Please see FIG. 2).

Figure 3G:
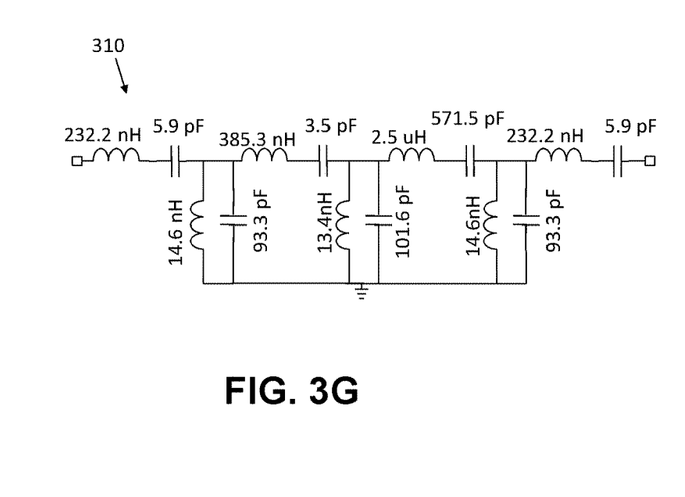

FIG. 3G shows an example embodiment of the bandpass filter block 310 having a multistage bandpass configuration, for coupling to antenna with frequency range C of 115-162 MHz (Please see FIG. 2).

Figure 3H:
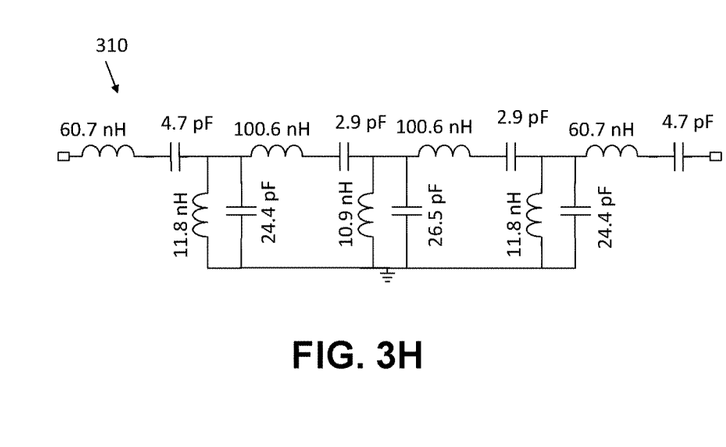

FIG. 3H shows an example embodiment of the bandpass filter block 310 having a multistage bandpass configuration, for coupling to antenna with frequency range of 220-400 MHz (Please see FIG. 2). With respect to FIGS. 3E-3H, it should be appreciated that the achievement of the capacitance values shown in FIGS. 3E-3H may be achieved through the use of capacitive elements such as are described in co-pending U.S. patent application Ser. No. 16/457,534 by Frederick Verd, entitled "High-power RF Capacitor", which application is hereby incorporated by reference herein.

Figure 4A:
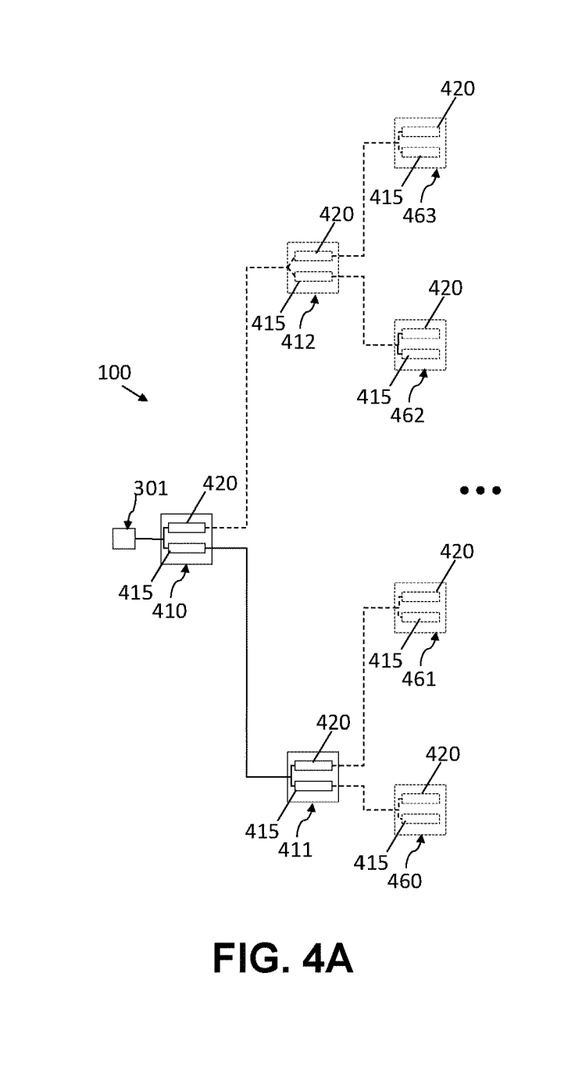
FIGS. 4A-4C are circuit diagrams.
Figure 4B:
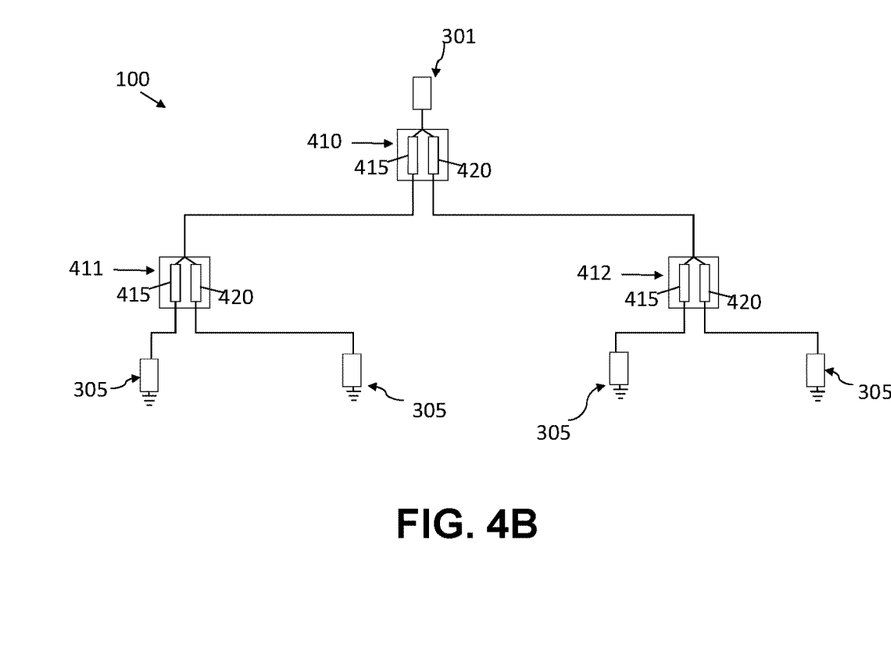
Figure 4C:
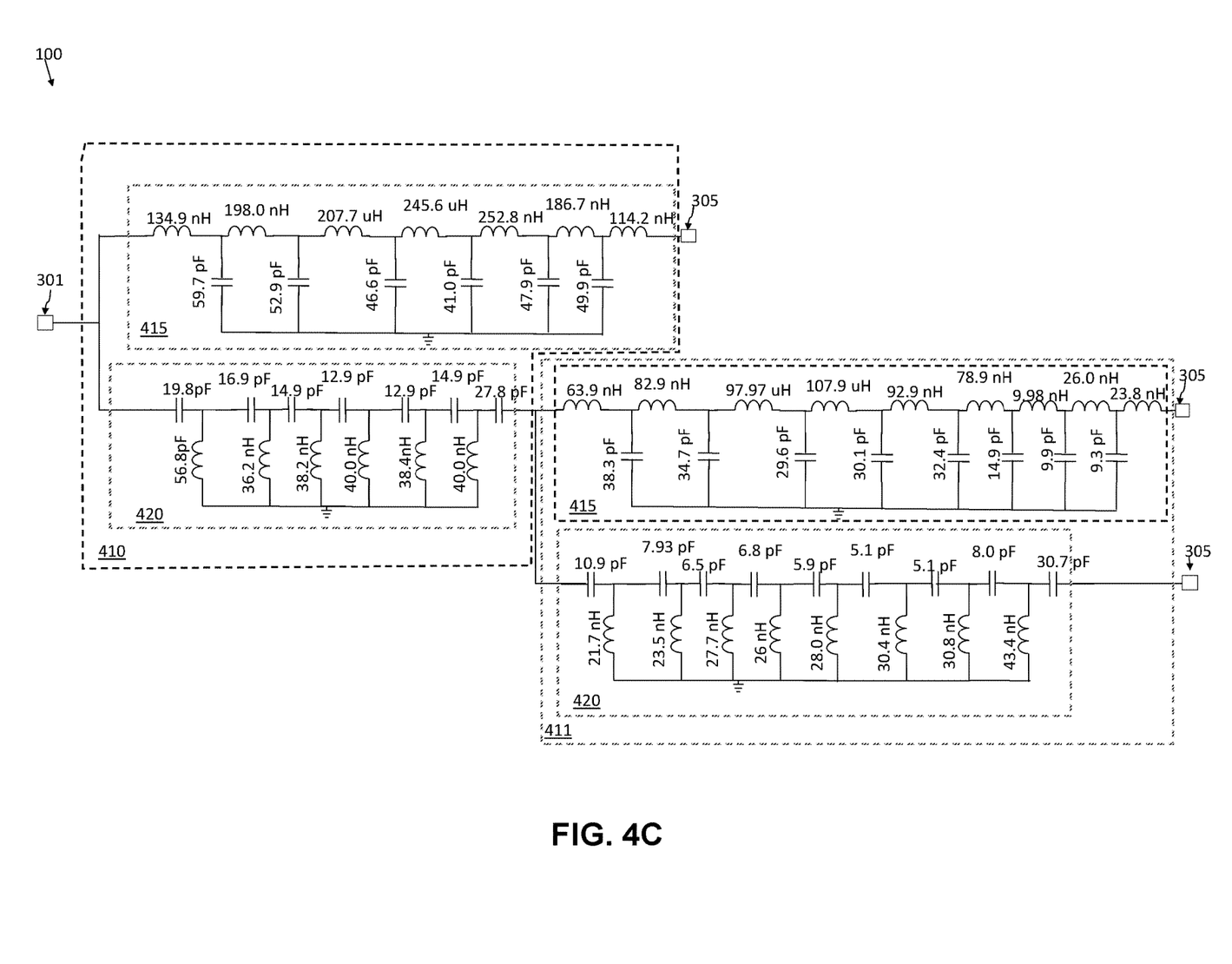

FIGS. 4A-4C depict a cascading diplexer configuration embodiment for the high-power multiplexer 100. In this embodiment, the high-power multiplexer 100 has a first terminal 301 and two or more other terminals 305 (FIGS. 4B-4C). FIG. 4B shows four of the two or more other terminals 305, thus the high-power multiplexer 100 shown in FIG. 4B can be for interfacing with four antennas 110 or communications electronics 103 (not shown in FIG. 4, but see FIG. 1B). The first terminal 301 may be a terminal for receiving an input signal to the high-power multiplexer 100, where the input is a broadband signal. The broadband signal may be transferred to the high-power multiplexer 100 via single cable 101. The input at first terminal 301 may be from communications electronics 103 of FIG. 1A, and the device is high-power multiplexer 100 of FIG. 1A, where the two or more other terminals 305 are output terminals for providing communications (or other) signals to antennas 110.

Alternatively, the first terminal 301 may be a terminal for an output signal of the high-power multiplexer 100, where the output is a broadband signal. The broadband signal may be transferred from the high-power multiplexer 100 from output terminal 301, via single cable 101, to communications device 103 (or another input of a device 103 as seen in FIG. 1B). In the case terminal 301 is an output, the two or more terminals 305 may be input to the high-power multiplexer 100.

The embodiment of the high-power multiplexer 100 shown in FIGS. 4A-4C can include one or more diplexer 410 (411, 412, 460, 461, 462, 463 also shown) coupled to the first terminal 301. The diplexer 410 includes a low pass filter 415 and a high pass filter 420. The low pass filter 415 and/or the high pass filter 420 may have a multi-order filter topology, a Chebychev topology, Bessel topology, Butterworth topology, or other RF filter topology known in the art. A frequency may be outside of the passband of either the low pass filter 415 or the high pass filter 420 if that frequency applied at an input terminal of the diplexer 410 is attenuated with less than a −3 dB attenuation at the other terminals of the low pass filter 415 or high pass filter 420. The cutoff frequency of the high pass filter and the low pass filter may be the frequencies with −3 dB attenuation. The cutoff frequencies may be the frequencies with the second −3 dB attenuation, for example, in a Chebychev topology of either the high pass filter 420 or the low pass filter 415. A frequency may be in the passband and/or for the low pass filter 415 or the high pass filter 420 if a signal that has that frequency applied at the input to the diplexer 410, appears at the respective terminal of either the high pass filter 420 or the low pass filter 415, with not less than −3 dB attenuation.

To select the cutoff frequencies of the filters 415, 420 of the diplexers 410, 411, 412, 460, 461, 462, 463 respective required antenna frequency ranges, and the number of antennas can be known (see also FIG. 2 for example). Cutoff frequencies for either of the diplexer, can be approximately upper or lower frequencies of the required antenna frequency ranges (or the passband of the antennas). Antennas may be ordered by frequency ranges, including by descending mid-frequency, or descending lower frequency, or descending upper frequency of the respective frequency ranges. Antennas may be ordered by ascending mid-frequency, or ascending lower frequencies, or ascending upper frequency of the respective frequency ranges.

If there is an even number of antennas (each with a respective frequency range), for N antennas 110 in an ordered arrangement of antennas 110, the first diplexer 410 may be a mid-band diplexer. The low pass cutoff of the low pass filter 415 of the mid-band diplexer 410 may be approximately the higher frequency of the $N^{th}//2$ antenna (where // denotes the integer floor of the division). The high pass cutoff of the high pass filter 420 of the mid-band diplexer 410 may be approximately the lower frequency of the $N^{th}//2+1$ antenna. The number of diplexers can be the number of bands (or antennas)−1.

If there is an odd number of antennas 110, the high pass cutoff for the high pass filter 420 of the mid-band diplexer 410 can be the lower frequency of the $N^{th}//2$ antenna in the sequence of antennas and the low pass frequency of the low pass filter 415 mid-band diplexer 410 can be the higher frequency of the $N^{th}//2$ −1 antenna in the sequence of antennas. Alternatively, the high pass cutoff frequency of the high pass filter 420 of the mid-band diplexer can be the lower frequency of the $N^{th}//2+1$ antenna while the low pass filter 415 cutoff frequency can be the higher frequency of the $N^{th}//2$ antenna.

A second diplexer 411, which can be a low band diplexer, can be coupled to the output of the low pass filter 415 of the first diplexer. A second diplexer 412, which can be a high band diplexer 412 can be coupled to the output of the high pass filter 420 of the first diplexer 410. The number of diplexers can be the number of bands (or antennas)–1.

FIG. 4A shows an embodiment of the high-power multiplexer 100 for reducing the number of cable runs to three or more antennas (not shown in FIG. 4A), having a cascading diplexer configuration. An input to each diplexer can be connected to each of an input to a low pass filter 415 of the each diplexer, and an input to a high pass filter 420 of the each diplexer. The outputs of each of the low pass filter 415 and high pass filters 420 of each diplexer can be unconnected.

For coupling the high-power multiplexer 100 to three or more antennas, there can be a first diplexer 410, and one or more other diplexers (diplexers 411, 412, 460, 461, 462, 463 shown, others implied by ellipses). For the "cascading" effective arrangement of the diplexers, each of the one or more other diplexers can be coupled to either the low pass filter 415 output of the first diplexer 410, or the high pass filter 420 output of the first diplexer 410 (but not both). Moreover, each of the fourth diplexers and counting, can be coupled to an output of either the second diplexer 411, or third diplexer 412 (but not both). Each diplexer other than the first diplexer, can be similarly cascaded, by being connected to the output of one or more other diplexer, in the cascade of diplexers. In other words, an input to each diplexer in a group consisting of the diplexers other than the first diplexer, can be coupled to at least one of i) an output of a high-pass filter of another diplexer (other than that diplexer) or ii) an output of a low-pass filter of another diplexer (other than that diplexer). An input to each diplexer (other than the first diplexer), can be coupled to at least one output of a high-pass filter 420 of another diplexer (other than that diplexer), at least one output of a low-pass filter 415 of another diplexer (other than that diplexer), or at least one output of a combination of high-pass filter 420 of another diplexer (other than that diplexer), or low-pass filter 415 of another diplexer (other than that diplexer).

For coupling the high-power multiplexer 100 to three antennas, for example, and as shown in FIG. 4A, there can be a first diplexer 410, and a second diplexer 411 coupled to a low pass filter 415 output (or high pass filter output 420) of the first diplexer 410. Output terminals (not shown in FIG. 4A) for coupling to each of the three antennas, can be coupled to each of the low pass filter 415 output and the high pass filter 420 outputs of the second diplexer 415, and the high pass filter 420 (or low pass filter 415) output of the first diplexer 410 that is uncoupled to the second diplexer 411. A low pass filter (not shown in FIG. 4A can be coupled between the terminal and the high pass filter 420 (or low pass filter 415) output of the first diplexer 410 that can be uncoupled to the second diplexer 411.

As yet another example and as seen in FIG. 4A, for coupling the high-power multiplexer 100 to five antennas, for example, there can be a first diplexer 410, a second diplexer 411 coupled to a low pass filter 415 output of the first diplexer 410, and a third diplexer 412 coupled to a high pass filter 420 output of the first diplexer 410. Further, a fourth diplexer 460 can be coupled to a low pass filter 415 output of the second diplexer 411. Output terminals (not shown in FIG. 4B) for coupling to each of the five antennas, can be coupled to each of the low pass filter 415 output and the high pass filter 420 outputs of the fourth diplexer 460, and the high pass filter 420 output of the second diplexer 410 that is uncoupled to the fourth diplexer 460. Moreover, output terminals can be coupled to each of the low pass filter 415 and high pass filter 420 outputs of the third diplexer 420. A low pass filter (not shown in FIG. 4A) can be coupled between the terminal and the high pass filter 420 output of the third diplexer 412, as needed.

For coupling the high-power multiplexer 100 to six antennas, for example, there can be a first diplexer 410, a second diplexer 411 coupled to a low pass filter 415 output of the first diplexer 410, and a third diplexer coupled to a high pass filter 420 output of the first diplexer 410. A fourth diplexer 460 can be coupled to a low pass filter 415 output of the second diplexer 411. A fifth diplexer 461 can be coupled to a high pass filter 420 output of the second diplexer 411. Output terminals (not shown in FIG. 4B) for coupling to each of the antennas, can be coupled to each of the low pass filter 415 output, and the high pass filter 420 outputs, of each of the third 412, fourth 460, and fifth 461 diplexers. A low pass filter (not shown in FIG. 4B) can be coupled between the terminal and the high pass filter 420 output of the third diplexer 412, as needed.

For coupling the high-power multiplexer 100 to eight antennas, for example, there can be a first diplexer 410, a second diplexer 411 coupled to a low pass filter 415 output of the first diplexer 410, and a third diplexer coupled to a high pass filter 420 output of the first diplexer 410. A fourth diplexer 460 can be coupled to a low pass filter 415 output of the second diplexer 411. A fifth diplexer 461 can be coupled to a high pass filter 420 output of the second diplexer 411. A sixth diplexer 462 can be coupled to the low pass filter 415 output of the third diplexer 412. A seventh diplexer 463 can be coupled to the high pass filter 420 output of the third diplexer 412. Output terminals (not shown in FIG. 4A) for coupling to each of the antennas, can be coupled to each of the low pass filter 415 output, and the high pass filter 420 outputs, of each of the fourth 460, fifth 461, sixth 462, and seventh 463 diplexers.

For clarity, for coupling the device to nine antennas (not shown in FIGS. 4A-4C), an eighth diplexer (not shown) can be coupled to an output of either the fourth 460 through seventh 463 diplexer. Terminals (not shown) can be connected to the outputs of the eighth diplexer, and the outputs of the fourth 460 through seventh 463 diplexers unconnected to the eighth diplexer.

Now referring to FIG. 4B, as an example, four antennas 110 can be coupled to the high-power multiplexer 100, a first antenna 110 having a range of DC to 9 MHz, a second antenna 110 having an operating range of 30-88 MHz, a third antenna 110, having an operating range of 115-174 MHz, and a fourth antenna having an operating range of 225-400 MHz. A first, mid-band diplexer 410 can be coupled to the first terminal 301 for receiving broadband signal. The first diplexer 410 can have a low pass filter 415 with a cutoff of 88 MHz, and a high pass filter 420 with a cutoff frequency of 118 MHz. A second diplexer 411, the low band diplexer, can have be coupled to the first diplexer 410 low pass filter 415 output and have a second diplexer 411 low pass filter 415 cutoff of 20 MHz. The second diplexer 411, the low band diplexer, can further have a second diplexer 411 high pass filter 420 cutoff of 30 MHz.

A third diplexer 412, which can be a high band diplexer, can be coupled to the output of the first diplexer 401 high pass filter 420. The third diplexer 412 can have a third diplexer 412 high pass filter 420 with a cutoff of 220 MHz, and a third diplexer 412 low pass filter 415 with a cutoff of 174 MHz. One of the four terminals 305 for coupling to the first antenna operating at DC to 9 MHz can be coupled to the output of the second diplexer 411 low pass filter 415. Another terminal 305 for coupling to the second antenna operating at 30-88 MHz can be coupled to the output of the second diplexer 411 high pass filter 420. Another terminal 305 for coupling to the third antenna operating at 115-174 MHz can be coupled to the output of the third diplexer 412 low pass filter 415 output. The fourth antenna having an operating range of 225-400 MHz can be coupled to the output of the third diplexer 412 high pass filter 420, via a lowpass filter (not shown), having a cutoff of 400 MHz.

Referring now to FIG. 4C, the electrical circuitry for the three channel multiplexer is shown in greater detail. FIG. 4C shows an example high-power multiplexer 100 for coupling to three antennas (with frequency ranges DC to 88 MHz, 118 MHz to 174 MHz, and 220 MHz and above) and having cascaded diplexers is shown. A first terminal 301 can be for receiving a broadband signal. A first diplexer 410 connected to the first terminal 301, can have a low pass filter 415 with an 88 MHz cutoff, and a high pass filter 420 with an 118 MHz cutoff. A terminal 305 for coupling to an antenna having a DC to 88 MHz operating range, can be connected to the output of the low pass filter 415 of the first diplexer 410. A second diplexer 411, is connected to the output of the high pass filter 420 of the first diplexer 410. The second diplexer can have a high pass filter 420 with a 220 MHz cutoff frequency, and a low pass filter 415 with a 174 MHz cutoff frequency. A second terminal 305 for coupling with the antenna having frequency ranges DC to 88 MHz can be connected to the low pass filter 415 of the first diplexer 410. A third terminal 305 for coupling to the antenna operating at 118 MHz to 174 MHz, can be coupled to the output of the low pass filter 415 of the second diplexer 411. A fourth terminal 305 for coupling the high-power multiplexer 100 to an antenna operating from 220 MHz can be coupled to the output of the second diplexer 411 high pass filter 420.

In some embodiments, the cascaded diplexer of FIGS. 4A-4C may further require discrete low pass filters or high pass filters instead of full diplexers 410, with no reciprocal high pass filter 420 or low pass filter 415 in the diplexer 410. For example if the antennas operate at DC to some frequency, the terminal 305 that can couple to that antenna may be connected to a low pass filter 415 having a cutoff frequency about that antenna frequency. Thus, the device may be designed with no diplexer arrangement 410 having a high pass filter 420 paired with that low pass filter 415. This can be shown at least in FIG. 4C, at the second terminal 305 for coupling with antenna having frequency ranges DC to 88 MHz, can be connected to the low pass filter 415 of the first diplexer 410 of FIG. 4C.

In some embodiments, the high-power multiplexer 100 may have a combination of cascaded diplexer arrangement, and cochlear manifold arrangement as seen in FIGS. 3A-3D. For example, circuit blocks 335, 330, and/or 340 as seen in FIGS. 3A-3C may be coupled to the output of either a high pass filter 420 or low pass filter 415 of one or more diplexers 410.

Some embodiments of the high-power multiplexer 100 feature cooling means. Cooling means may include nonconductive cooling, liquid cooling, phase change materials, nonconductive cooling between the capacitive element and conductive cooling. Cooling fins may be attached to the capacitive elements of the high-power multiplexer 100. Where the capacitive elements are embedded in a PCB, cooling fins can be perpendicular to a plane of the PCB. Effectiveness of cooling means can be expressed in dB, or expressed in temperature (at certain frequency and power).

In embodiments where the device is embedded in a PCB, capacitive elements may be high-power RF capacitors embedded into the layers of the PCB. For example, the capacitors of FIG. 4C and/or FIGS. 3E-3H can be such PCB embedded capacitors.

In some embodiments of the high-power multiplexer 100, grounding straps may be added to ground of terminals 305, to create a uniform ground plane and improve channel isolation across the passband. In some embodiments, capacitors can be added to shunt inductors to reduce their inter-turn capacitance response at certain frequencies.

Figure 5:
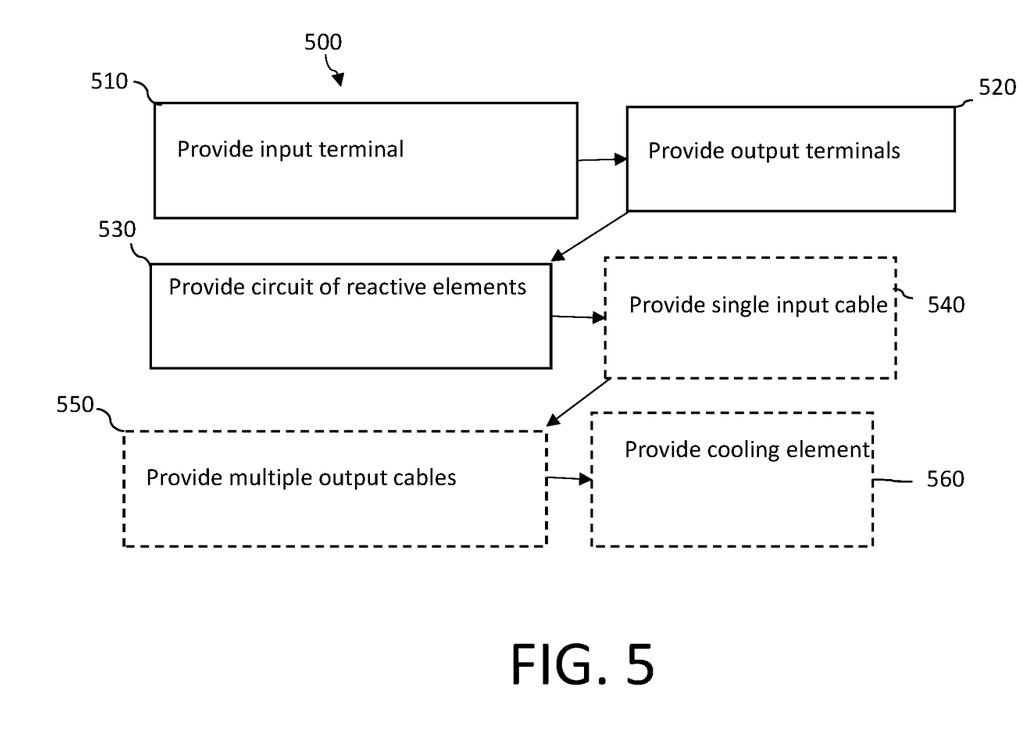
FIG. 5 is a flow chart of a method for reducing cable runs on a platform.

FIG. 5 shows a method 500 for reducing a number, or quantity of cable runs to antennas. The method 500 includes the step 510 of providing an input terminal. The input terminal can receive a broadband RF signal from a single input cable. The RF signal can be from DC to 1000 MHz. The method further includes the step 520 of providing at least two output terminals. Each output terminal can be configured to transmit output signals to a respective antenna at an expected; i) impedance, ii) signal frequency range and iii) signal power for the output signals. The antenna can exhibit a load at the terminal.

The method 500 further includes the step 530 of providing a circuit of reactive elements coupled between the input terminal and the at least two output terminals. The circuit can separate the broadband signal into two or more expected (by the antennas) frequency ranges. The frequency ranges can be disjoint. In other words, the channels to the antennas can have at least 20 dB channel isolation. In other words, the antennas can have non-overlapping ranges. The circuit can further match the impedance of the circuit to certain impedance expected by the antennas. The reactances and the arrangement of reactive elements in the circuit can be selected such that when a broadband RF signal is applied at the input terminal, each of the two or more disjoint frequencies are applied at the respective output terminals while i) the impedance of the circuit at each output terminal sufficiently matches the certain impedance at the output terminal, ii) the power at each output terminal sufficiently matches a certain power, and ii) insertion losses are minimized throughout the device. At least a portion of the circuit can have at least one of a cochlear manifold bandpass circuit arrangement, or a cascaded diplexer arrangement (or both). In other words, the circuit can have either a cochlear manifold bandpass circuit arrangement, or a cascaded diplexer arrangement, or both.

The method 500 can further include the step 540 of providing a single input cable at the input terminal. The method 500 can further include the step 550 of providing multiple output cables between the output terminals and the two or more antennas. The input cable can have a length larger than the average length of the output cables. The method 500 can further include the step 560 of providing a cooling element proximal to reactive elements. The cooling element can be configured as a cooling means sufficient to minimize losses in the device. The cooling means can include conductive fins coupled to the capacitive elements.

The cascaded diplexer approach, as seen at least in FIGS. 4A-4C may be advantageous over the cochlear and manifold approach shown in FIGS. 3A-3H, in applications where reactive elements may be selected with lower current, voltage, and/or power ratings. The cochlear manifold approach may be advantageous in other situations where a high insertion loss at frequency can be required by one of the antennas, but that is distant from the midband frequency.

Figure 6:
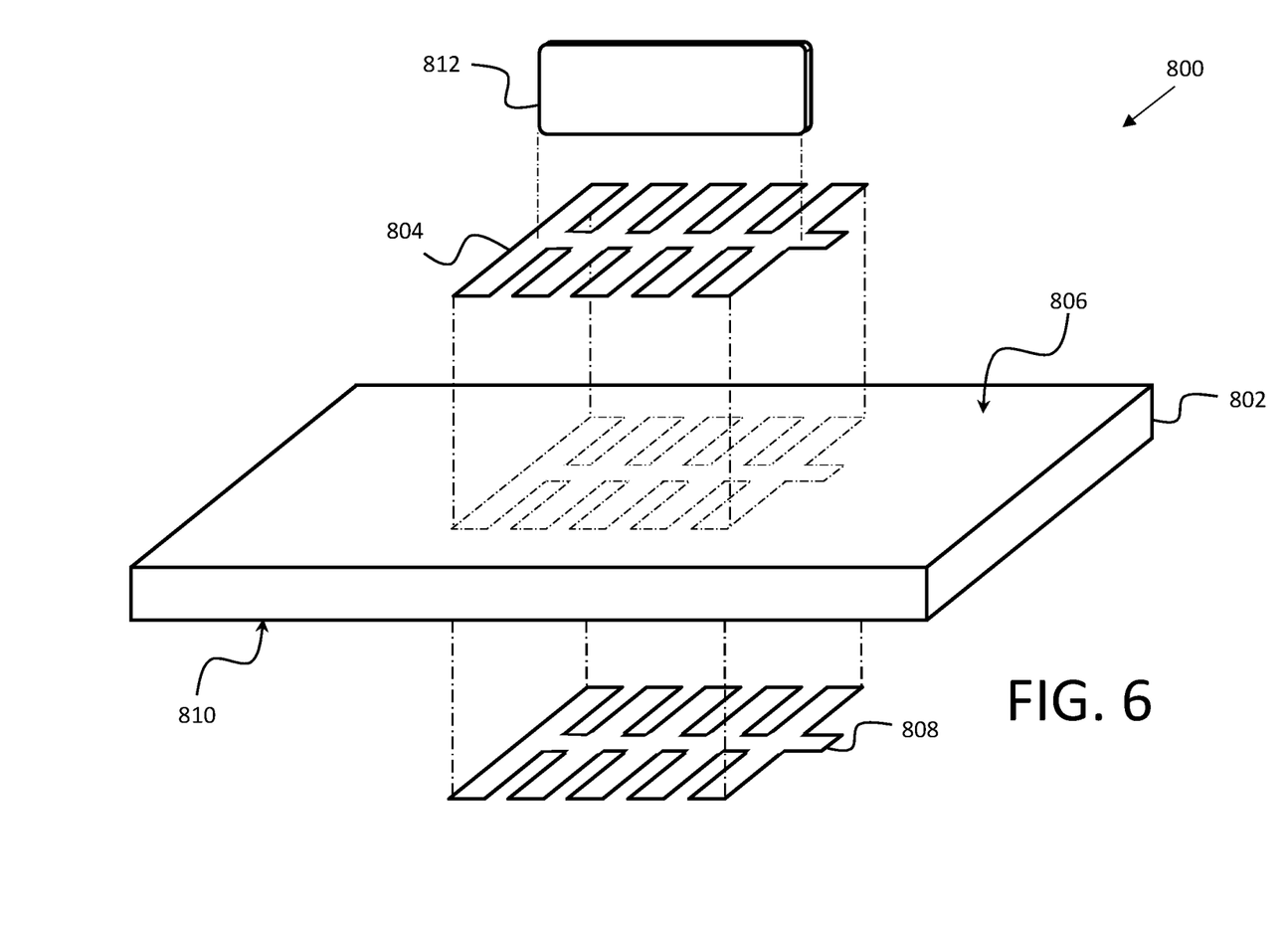
FIG. 6 is an expanded, perspective view of a capacitive element.

FIG. 6 is an illustration of an embodiment of a capacitive element 800 that is integrated into a printed circuit board dielectric substrate 802. In this embodiment, the capacitive element 800 comprises a first conductive layer 804 deposited on a first side 806 of the dielectric substrate 802 and a second conductive layer 808 deposited on an opposite side 810 of the dielectric substrate 802. This arrangement of conductive layers provides a broadside coupling capacitance effect between the first conductive layer 804 and the second conductive layer 808. In this embodiment of the capacitive element 800, the first conductive layer 804 and the second conductive layer 808 have a double-sided comb shape. Also shown in FIG. 6 is an optional cooling fin 812 that may be attached to the capacitive element 800 so as to enable heat transfer away from the capacitive element 800.

The foregoing description of various embodiments have been presented for purposes of illustration and description. It is not intended to be exhaustive or to limit the invention to the precise forms disclosed, and many modifications and variations are possible in light of the above teachings. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto. Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the term "element". An element may be comprised of multiple discreet elements that co-operate or interact with each other to have substantially the properties of the element. For example, capacitive/inductive/resistive elements may be comprised of multiple capacitive/inductive/resistive elements in series and/or in parallel.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

We claim:

1. A high-power multiplexer comprising:
   an input terminal configured for receiving a signal at a first radio frequency range;
   at least two inductive elements, wherein a first of the at least two inductive elements is arranged in series with the input terminal;
   a number of bandpass filters equal to the number of inductive elements, each bandpass filter corresponding to, and electrically connected in series to, one of the at least two inductive elements, wherein each bandpass filter has a respective frequency range and one of the bandpass filters having the highest frequency range is arranged electrically proximal in series with the first inductive element;
   wherein the bandpass filters are arranged by decreasing respective higher frequency such that the bandpass filter with the highest frequency is connected to the input terminal and each subsequent bandpass filter is increasingly electrically distant to the input terminal; and wherein a last of the at least two inductive elements is arranged in series with a last bandpass filter having a passband with the lowest top end;
   at least two output terminals, wherein the number of output terminals is equal to the number of bandpass filters, and each of the at least two output terminals is arranged in series with one of the bandpass filters to comprise a respective filter block; and
   wherein each subsequent pair of filter blocks are spaced apart by one of the at least two inductive elements, and each of the filter blocks is arranged in parallel with a respective circuit block, wherein the respective circuit block comprises: i) a respective filter block that has a lower bandpass higher frequency than another parallel filter block, and ii) a respective inductive element.

2. The high-power multiplexer of claim 1, wherein each of the bandpass filters comprises a multi-stage bandpass filter.

3. The high-power multiplexer of claim 2, wherein the bandpass stage of each multi-stage bandpass filter comprises either an inductive element arranged in series with a capacitive element and further in series with a load comprising the respective output terminal, or an inductive element arranged in parallel with a capacitive element and further in parallel with a load comprising the respective output terminal, and no bandpass stages of a same type are adjacent.

4. The high-power multiplexer of claim 3, wherein the multi-stage bandpass filter comprises an odd number of bandpass stages, and reactances of elements of the bandpass stages are symmetric about a middle stage in an ordered arrangement of stages; and the reactances of the elements of the bandpass stages are selected such that the bandpass stages are ordered with higher resonant frequencies arranged proximal to the middle stage.

5. The high-power multiplexer of claim 4, wherein a first bandpass filter of the bandpass filters has a frequency range within 225 MHz to 460 MHz, a second bandpass filter of the bandpass filters has a frequency range within 118 MHz to 174 MHz, a third bandpass filter of the bandpass filters has a frequency range within 24 MHz to 96 MHz, and a fourth bandpass filter of the bandpass filters has a frequency range within 2.5 MHz to 12 MHz.

6. The high-power multiplexer of claim 1, wherein the high-power multiplexer is disposed on a printed circuit board (PCB), and an inductance of the at least two inductive elements is determined to minimize a loss across conductive traces of the PCB from the input terminal to each bandpass filter.

7. The high-power multiplexer of claim 6, wherein the inductance of the at least two inductive elements is determined to match the impedance across the conductive traces of the PCB from the input terminal to each bandpass filter.

8. The high-power multiplexer of claim 1, wherein reactances of the inductive elements of the high-power multiplexer are selected such that impedance at the input terminal substantially matches an impedance of at least one of the at least two output terminals.

9. The high-power multiplexer of claim 1, wherein reactances of the inductive elements of the device are selected such that insertion losses in the high-power multiplexer are minimized.

10. A method for reducing a quantity of cable runs to antennas, the method comprising the steps of:
　A) providing an input terminal, the input terminal configured to receive a broadband radio frequency (RF) signal from a single input cable;
　B) providing at least two output terminals, wherein each output terminal is configured to transmit output signals to a respective antenna of the antennas, and wherein the respective antennas have certain i) impedances, ii) signal frequency ranges, and iii) signal power for the output signals;
　C) providing a circuit of reactive elements coupled between the input terminal and the at least two output terminals, the circuit configured for separating the broadband RF signal into two or more disjoint frequency ranges, and further configured so that the circuit matches an impedance of the at least two output terminals to the impedance of each of the respective antennas;
　wherein reactances and an arrangement of the reactive elements in the circuit are selected such that when the broadband RF signal is applied at the input terminal, each of the two or more disjoint certain frequency ranges are applied at the respective output terminals while the impedance of the circuit at each output terminal sufficiently matches the certain output terminal impedance, the signal power at each output terminal sufficiently matches the certain signal power and insertion losses are minimized.

11. The method of claim 10, further comprising the step of:
　D) providing a cooling element proximal to the reactive elements;
　wherein the cooling element is configured as a cooling means sufficient to minimize the insertion losses.

12. The method of claim 11, further comprising the steps of:
　E) providing the single input cable coupled to the input terminal;
　F) providing at least two output cables, wherein each output cable is coupled between a respective output terminal and one of the respective antennas; and
　wherein the single input cable has a length ten times or more than an average length of the output cables.

13. The method of claim 10, wherein at least a portion of the circuit of reactive elements comprises at least one arrangement from the group consisting of a cochlear manifold bandpass circuit or a cascading diplexer circuits.

14. A high-power radio frequency (RF) multiplexer comprising:
　a first terminal;
　a first high pass filter having a first plurality of inductive elements arranged in series between the first terminal and a second terminal, and further having a first plurality of capacitive elements connected in parallel with the first plurality of inductive elements such that each connection point between two inductive elements of the first plurality of inductive elements is connected to a first end of a respective capacitive element and second ends of each of the first plurality of capacitive elements are electrically connected; and
　a first low pass filter having a second plurality of capacitive elements arranged in series between the first terminal and a third terminal, and further having a second plurality of inductive elements connected in parallel with the second plurality of capacitive elements such that each connection point between two capacitive elements of the second plurality of capacitive elements is connected to a first end of a respective inductive element of the second plurality of inductive elements and second ends of each of the second plurality of inductive elements are electrically connected.

15. The high-power RF multiplexer of claim 14, wherein the high pass filter and the low pass filter are bidirectional such that the high-power RF multiplexer is capable of serving as a multiplexer or as a demultiplexer.

16. The high-power RF multiplexer of claim 14, wherein the high pass filter and the low pass filter are not connected to a power source other than incoming RF energy.

17. The high-power RF multiplexer of claim 14, further comprising:
　a second high pass filter having a third plurality of inductive elements arranged in series between the third terminal and a fourth terminal, and further having a third plurality of capacitive elements connected in parallel with the third plurality of inductive elements such that each connection point between two inductive elements of the third plurality of inductive elements is connected to a first end of a respective capacitive element and second ends of each of the third plurality of capacitive elements are electrically connected; and
　a second low pass filter having a fourth plurality of capacitive elements arranged in series between the third terminal and a fifth terminal, and further having a fourth plurality of inductive elements connected in parallel with the fourth plurality of capacitive elements such that each connection point between two capacitive elements of the fourth plurality of capacitive elements is connected to a first end of a respective inductive element of the fourth plurality of inductive elements and second ends of each of the fourth plurality of inductive elements are electrically connected.

18. The high-power RF multiplexer of claim 14, wherein the first and second pluralities of capacitive elements are integrated into a printed circuit board dielectric substrate such that each capacitive element has a first conductive layer deposited on a first side of the dielectric substrate and a second conductive layer deposited on an opposite side of the dielectric substrate so as to provide a broadside coupling capacitance effect between the first conductive layer and the second conductive layer.

19. The high-power RF multiplexer of claim 18, wherein the first conductive layer and the second conductive layer have a double-sided comb shape.

20. The high-power RF multiplexer of claim 19, wherein each of a majority of all the capacitive elements has a corresponding cooling fin attached thereto so as to enable heat transfer away from the respective capacitive element to which the corresponding cooling fin is attached.

* * * * *